(12) United States Patent
Chen et al.

(10) Patent No.: US 8,059,410 B2
(45) Date of Patent: Nov. 15, 2011

(54) HEAT DISSIPATION DEVICE

(75) Inventors: Chun-Chi Chen, Taipei Hsien (TW);
Hong-Cheng Yang, Shenzhen (CN);
Cheng Kong, Shenzhen (CN);
Wei-Cheng Nie, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 269 days.

(21) Appl. No.: 12/504,682

(22) Filed: Jul. 17, 2009

(65) Prior Publication Data

US 2010/0258277 A1 Oct. 14, 2010

(30) Foreign Application Priority Data

Apr. 10, 2009 (CN) .......................... 2009 1 0301479

(51) Int. Cl.
*H05K 7/20* (2006.01)
*G06F 1/20* (2006.01)

(52) U.S. Cl. ............... 361/719; 361/679.47; 361/679.48; 361/679.52; 361/679.54; 361/679.55; 361/695; 361/697; 361/700; 361/704; 361/709; 165/80.2; 165/80.3; 165/104.33; 165/185; 24/518; 292/DIG. 16

(58) Field of Classification Search . 361/679.47–679.48, 679.52, 679.54–679.55, 361/695–697, 700, 704, 709; 165/80.2–80.3, 165/104.33, 185; 24/518; 292/31, 303, 341.17, 292/DIG. 16
See application file for complete search history.

(56) References Cited

U.S. PATENT DOCUMENTS

| 6,347,036 | B1 * | 2/2002 | Yeager et al. | 361/679.46 |
| 6,400,565 | B1 * | 6/2002 | Shabbir et al. | 361/679.54 |
| 7,461,661 | B2 * | 12/2008 | Chudzik et al. | 132/273 |
| 7,855,889 | B2 * | 12/2010 | Hung et al. | 361/700 |
| 7,990,713 | B2 * | 8/2011 | Liu et al. | 361/700 |
| 2010/0258276 | A1 * | 10/2010 | Chen et al. | 165/104.26 |

* cited by examiner

*Primary Examiner* — Robert J Hoffberg
(74) *Attorney, Agent, or Firm* — Altis Law Group, Inc.

(57) ABSTRACT

A heat dissipation device for dissipating heat from an electronic component mounted on a printed circuit board, includes a fin unit, a heat-conducting board attached to the electronic component, a heat pipe thermally connecting the fin unit and the heat-conducting board, and a clip disposed on the heat pipe. A pair of engaging portions protrude upwardly from a top face of the heat-conducting board towards each other. The clip secures the heat pipe to the top face of the heat-conducting board. The clip includes a pivoting portion which is pivotally fixed to the heat-conducting board, a clasping portion detachably engaging with the engaging portions, and a main body interconnecting the pivoting portion and the clasping portion and abutting against the heat pipe toward the heat-conducting board.

13 Claims, 5 Drawing Sheets

HEAT DISSIPATION DEVICE

BACKGROUND

1. Technical Field

The disclosure generally relates to heat dissipation devices and, more particularly, to a heat dissipation device incorporating heat pipes.

2. Description of Related Art

With the fast development of electronic industry, advanced electronic components such as CPUs (central processing units), or GPUs (graphics processing units) are being made with ever faster operating speeds. In addition, successive new models of mobile computers, such as notebook computers, are continuing to shrink in size and become lighter, smaller and thinner. Thus, with the improvement of the functionality of the notebook computers, heat generated from CPUs, GPUs, disk drives, power supplies and other components of the notebook computers is often increased. Greater emphasis is now being laid on increasing the efficiency and effectiveness of heat dissipation devices so as to keep operational temperature of the electronic components within a suitable range.

Nowadays, heat pipes, which operate by phase change of working liquid sealed therein, have been widely used due to their excellent heat transfer properties. Accordingly, heat dissipation devices equipped with heat pipes appear in many current applications and are widely used, with optimal performance thereof towards a common goal in current R & D efforts.

However, since the notebook computers are continuing to shrink in size and become thinner, a distance between the heat-generating components within the notebook computer and a shell of the notebook computer becomes smaller and smaller. It is difficult to dissipate heat generated from the heat-generating components effectively, particularly, to ensure a temperature of the heat-generating components within a safe threshold level.

What is needed, therefore, is a heat dissipation device incorporating heat pipes with enhanced heat dissipation performance.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
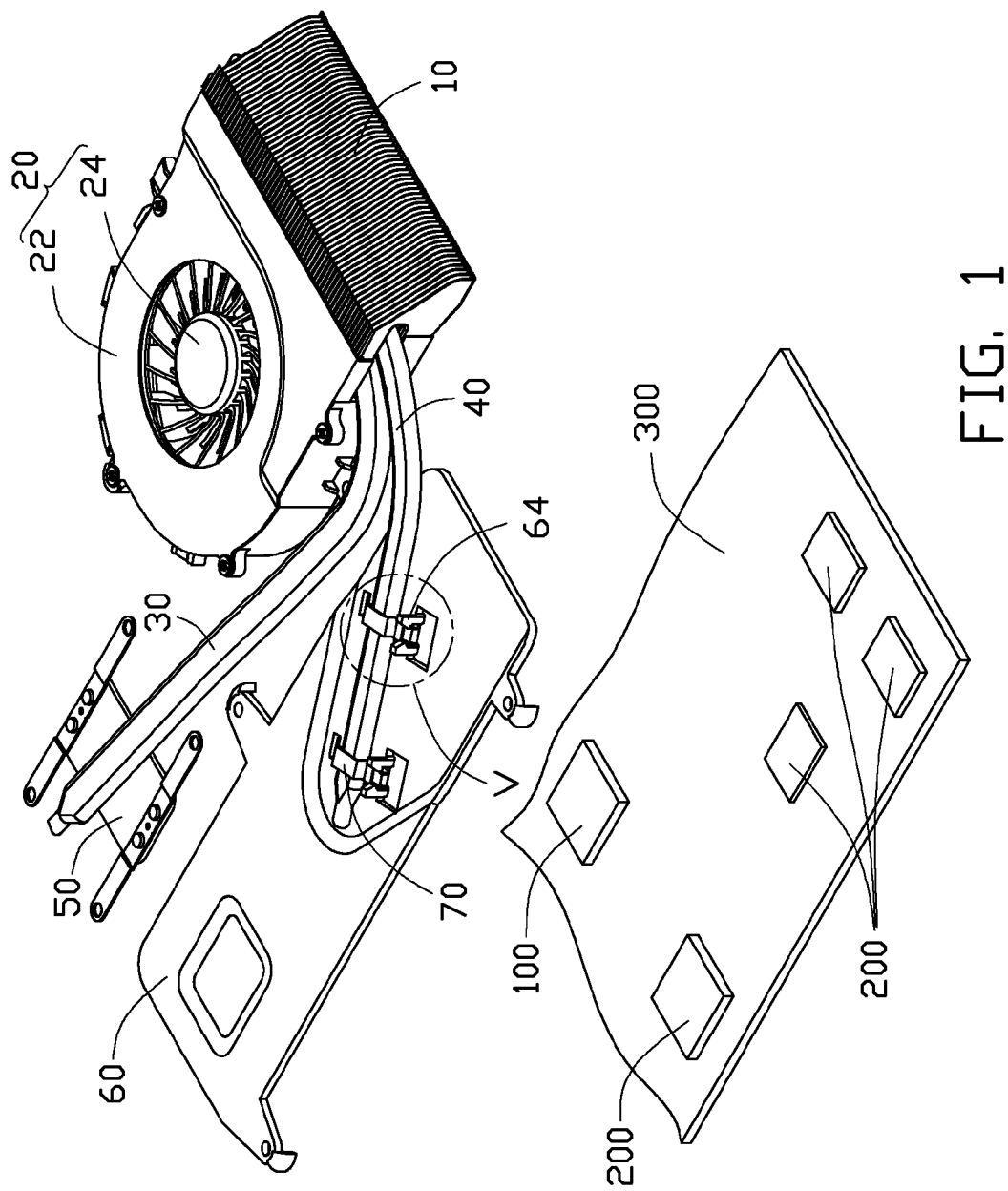
FIG. 1 is an assembled, isometric view of a heat dissipation device in accordance with an embodiment of the disclosure, with a printed circuit board having electronic components positioned thereon.
Figure 2:
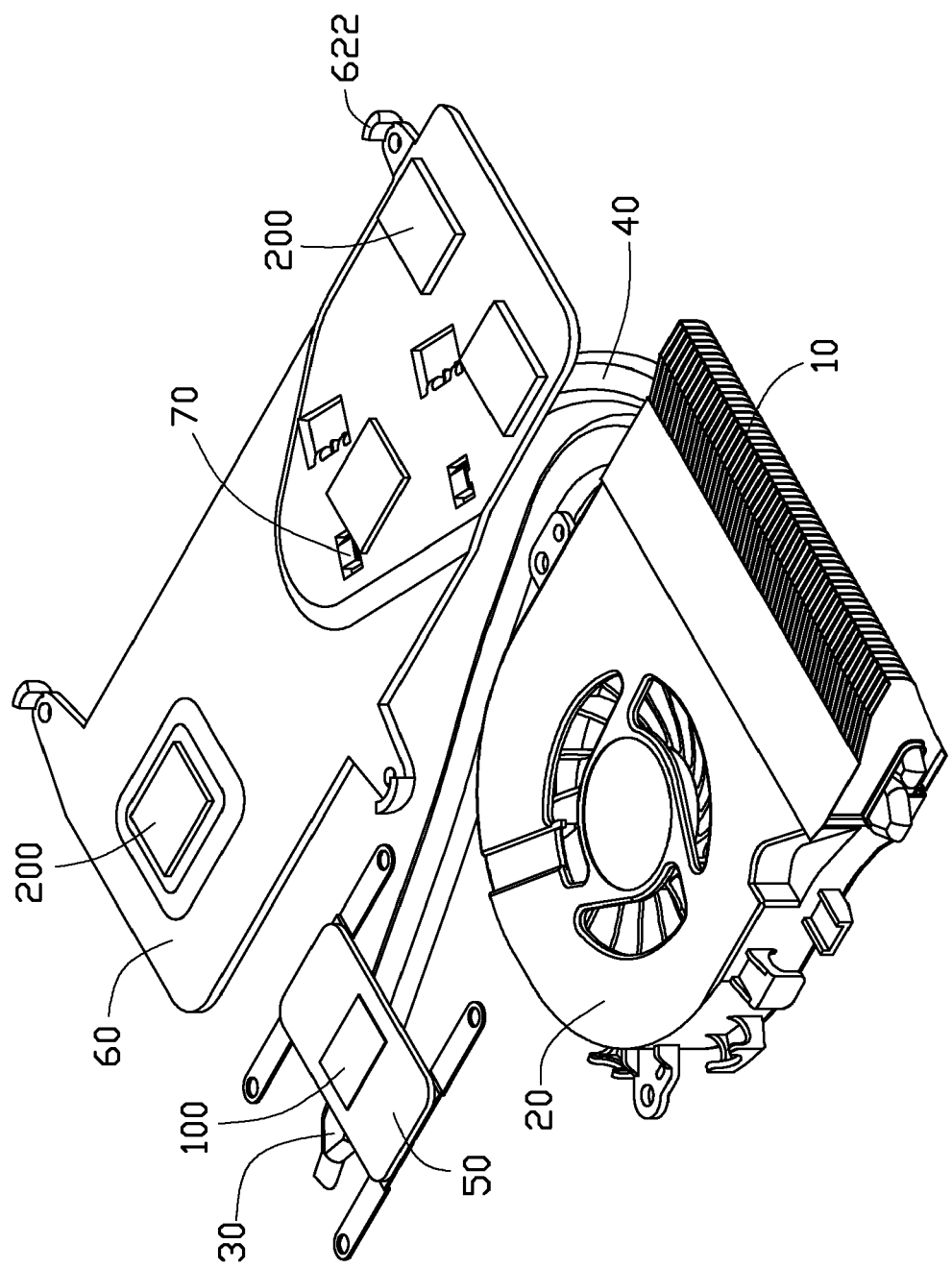
FIG. 2 is an inverted view of the heat dissipation device of FIG. 1.

Referring to FIGS. 1-2, a heat dissipation device in accordance with an embodiment of the disclosure dissipates heat from a first electronic component 100 such as a CPU (central processing unit) and a plurality of second electronic components 200 such as a GPU (graphics processing unit) 200, a VRM (voltage regulator module) 200, a Southbridge chip 200 and a Northbridge chip 200 simultaneously, which are arranged on a printed circuit board 300. The heat dissipation device comprises a fin unit 10, a centrifugal fan 20 located adjacent thereto, a first heat pipe 30 and a second heat pipe 40 thermally connecting with the fin unit 10, a first heat-conducting board 50 thermally attached to the first electronic component 100, a second heat-conducting board 60 thermally attached to the second electronic components 200, and a plurality of clips 70 engaging with the second heat-conducting board 60 and securing the second heat pipe 40 to the second heat-conducting board 60. The heat pipes 30, 40 connect the heat-conducting boards 50, 60 and the fin unit 10.

Figure 3:
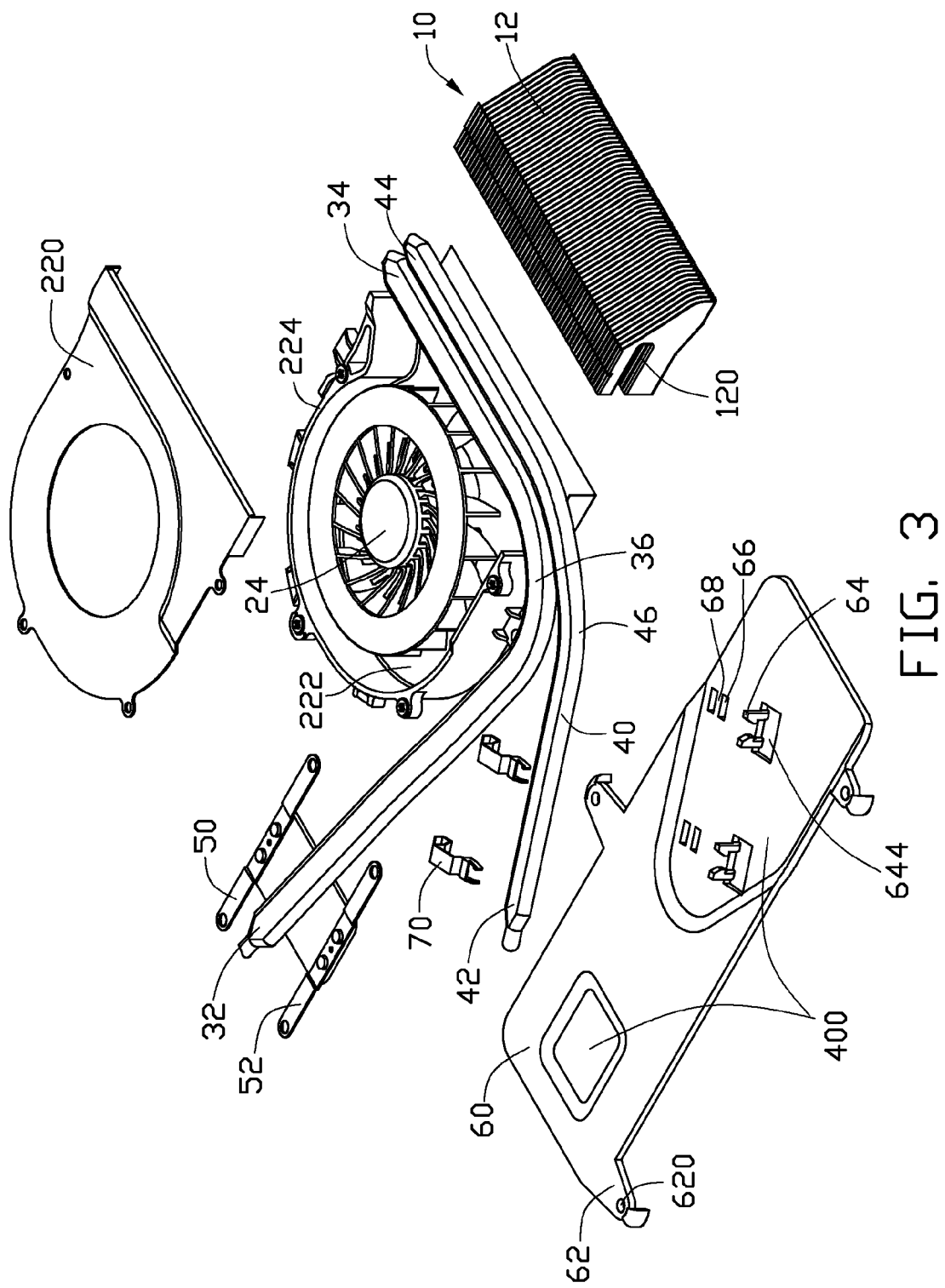
FIG. 3 is an exploded view of the heat dissipation device of FIG. 1.

Referring to FIG. 3 also, the fin unit 10 comprises a plurality of fins 12, each of which consists of an upright sheet body and a pair of flanges bent horizontally from a top and a bottom of the sheet body and engaging with the sheet body of an adjacent fin 12. Every two adjacent fins 12 form a passage therebetween for allowing airflow therethrough. An elongated receiving groove 120 is defined at a front side of the fin unit 10 and faces the centrifugal fan 20, for accommodating parts of the heat pipes 30, 40 therein. The receiving groove 120 extends transversely and perpendicularly through the fin unit 10 and is located at a left side of the fin unit 10.

The centrifugal fan 20 comprises a housing 22 engaging with the fin unit 10 and an impeller 24 rotatably disposed in the housing 22. The housing 22 comprises a top plate 220, a bottom plate 222 located opposite to the top plate 220 and a volute sidewall 224 extending upwardly from an outer periphery of the bottom plate 222 and fixed to the top plate 220. Each of the top plate 220 and the bottom plate 222 defines a through hole at a center thereof for functioning as an air inlet for the centrifugal fan 20. The top plate 220, the bottom plate 222, and the sidewall 224 cooperatively define a receiving space for receiving the impeller 24 therein. The sidewall 224 defines a rectangular air outlet at a right lateral side of the housing 22. The fin unit 10 is partly received in the air outlet of the housing 22, and the passages of the fin unit 10 directly communicate with the air outlet.

The first heat pipe 30 comprises a straight first evaporating section 32, a straight first condensing section 34 and a bended first connecting section 36 interconnecting the first evaporating section 32 and the first condensing section 34. The first evaporating section 32 is thermally attached to the first heat-conducting board 50. The first condensing section 34 is thermally received in the receiving groove 120 of the fin unit 10. A bottom face and a top face of the first heat pipe 30 are planar.

The first heat-conducting board 50 is a rectangular plate, and made of a metal with good heat conductivity, such as aluminum, copper, or an alloy thereof. A bottom face of the first heat-conducting board 50 is correspondingly attached to the first electronic component 100. The first evaporating section 32 of the first heat pipe 30 is mounted on a top face of the first heat-conducting board 50. Two mounting members 52 are further provided to the first heat-conducting board 50, for fixing the first heat-conducting board 50 to the printed circuit board 300. The two mounting members 52 are disposed at two opposite front and rear sides of the first heat-conducting board 50, respectively. The first heat pipe 30 is soldered to the top face of the first heat-conducting board 50, thereby securing the first heat pipe 30 on the first heat-conducting board 50.

The second heat pipe 40 is similar to the first heat pipe 30, and comprises a straight second evaporating section 42, a straight second condensing section 44 and a bended second connecting section 46 interconnecting the second evaporating section 42 and the second condensing section 44. The second evaporating section 42 is thermally attached to the second heat-conducting board 60. The second condensing section 44 is thermally received in the receiving groove 120 of the fin unit 10 and located juxtaposed to the first condensing section 34 of the first heat pipe 30. A bottom face and a top face of the second heat pipe 40 are planar. The second heat pipe 40 is coplanar with the first heat pipe 30.

Figure 4:
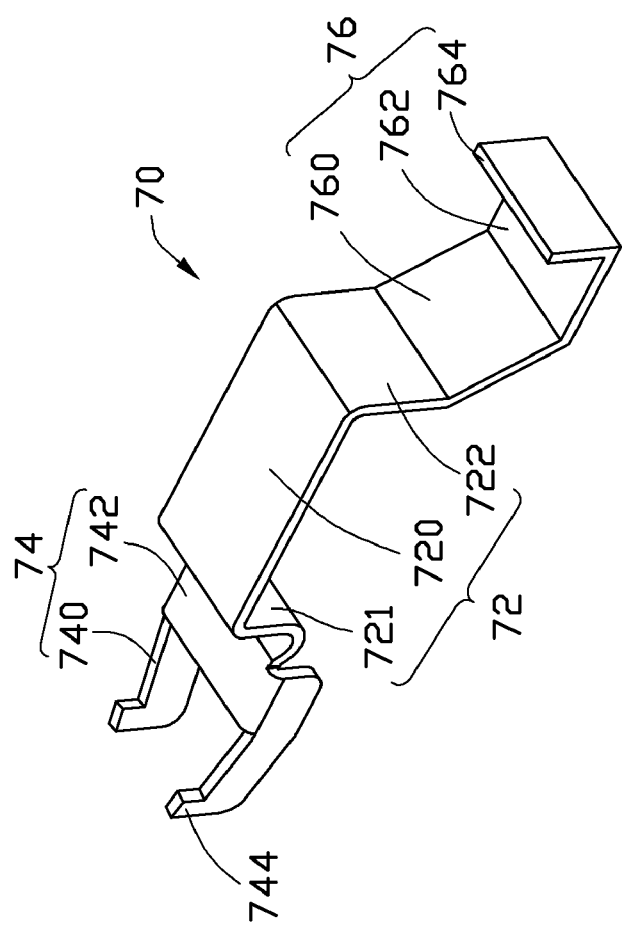
FIG. 4 is an enlarged view of a clip of the heat dissipation device of FIG. 1.
Figure 5:
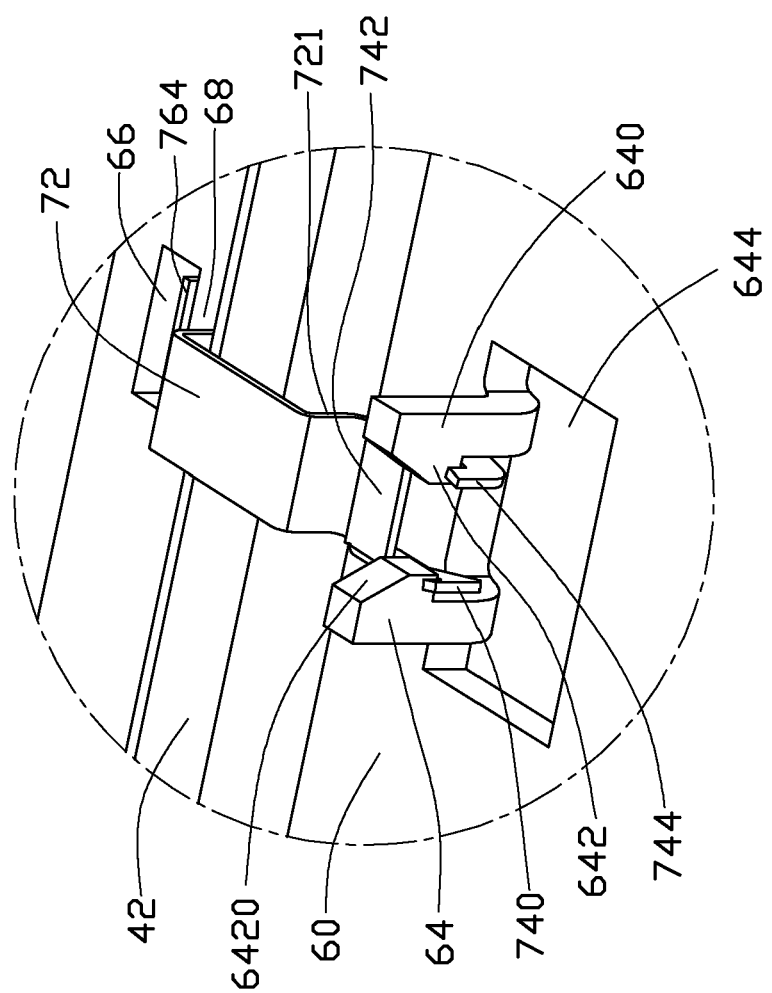
FIG. 5 is an enlarged view of part V of the heat dissipation device of FIG. 1.

Referring to FIGS. 4-5 also, the second heat-conducting board 60 is an approximately rectangular plate, and made of a metal with good heat conductivity, such as aluminum, copper, or an alloy thereof. A bottom face of the second heat-conducting board 60 is attached to the second electronic components 200. A plurality of heat-absorbing portions 400 are recessed in a top face of the second heat-conducting board 60 and protruded downwardly from the bottom face of the second heat-conducting board 60. The heat-absorbing portions 400 are located corresponding to the second electronic components 200, for achieving an intimate attachment between the second heat-conducting board 60 and the second electronic components 200. A right heat-absorbing portion 400 has an area larger than that of a left heat-absorbing portion 400. The left heat-absorbing portion 400 contacts one second electronic component 200, the right heat-absorbing portion 400 contacts a plurality of second electronic components 200. The second heat pipe 40 is disposed on and extends along the right heat-absorbing portion 400. A plurality of spaced mounting arms 62 extend outwardly and horizontally from an outer periphery of the second heat-conducting board 60. Each of the mounting arms 62 defines a mounting hole 620 at a center thereof, for a screw (not shown) extending therethrough to mount the second heat-conducting board 60 on the printed circuit board 300. A positioning hook 622 is bent downwardly from a distal end of each mounting arm 62 to locate the second heat-conducting board 60 at a desired position of the printed circuit board 300. Two pairs of inverted L-shaped engaging portions 64 protrude upwardly from the top face of the second heat-conducting board 60. The engaging portions 64 in each pair are aligned with each other. The engaging portions 64 are formed by stamping corresponding parts of the second heat-conducting board 60, whereby two rectangular stamped holes 644 are formed in the second heat-conducting board 60 corresponding to the two pairs of engaging portions 64. Taking one pair of the engaging portions 64 as an example, each of the two engaging portions 64 comprises an upright section 640 bended upwardly from the second heat-conducting board 60 and a hooking section 642 extending horizontally from an upper end of the upright section 640. The two upright sections 640 are perpendicular to the second heat-conducting board 60, and the two hooking sections 642 extend towards each other and are parallel to the second heat-conducting board 60. A part of an upper portion of each hooking section 642 is cut off, thereby forming an inclined guiding face 6420, for facilitating insertion of the clip 70 into the pair of engaging portions 64. Two elongated engaging holes 66 are defined in the second heat-conducting board 60 beside each pair of engaging portions 64. The two engaging holes 66 are juxtaposed to each other and parallel to the pair of engaging portions 64. The two engaging holes 66 are aligned with each stamped hole 644. An elongated baffle shaft 68 is formed between the two engaging holes 66. The second evaporating section 42 of the second heat pipe 40 is attached to the top face of the second heat-conducting board 60 and extends between the engaging portions 64 and the engaging holes 66.

Each of the clips 70 is integrally formed by stamping and bending a resilient metal sheet. The clip 70 comprises a main body 72, a clasping portion 74 extending outwardly from a front side of the main body 72, and a pivoting portion 76 extending outwardly from a rear side of the main body 72 opposite to the clasping portion 74. The main body 72 is in an inverted U-like configuration and comprises a rectangular plate 720, a front sidewall 721 extending downwardly and perpendicularly from a front lateral side of the plate 720, and a rear sidewall 722 extending downwardly and perpendicularly from a rear lateral side of the plate 720. The plate 720 of the main body 72 abuts against and spans the top face of the second evaporating section 42 of the second heat pipe 40; and the two sidewalls 721, 722 are attached to two lateral sides of the second evaporating section 42, respectively. The clasping portion 74 comprises a connecting section 742 bended forwardly from a bottom end of the front sidewall 721 of the main body 72, and two arms 740 extending forwardly and horizontally from two lateral sides of the connecting section 742, respectively. The two arms 740 abut against bottom faces of the two hooking sections 642 of the pair of engaging portions 64, respectively, when the clip 70 is locked with the engaging portions 64. A flange 744 extends upwardly from each arm 740 at a distal end thereof. The two flanges 744 abut against front faces of the two hooking sections 642 when the clip 70 is locked with the pair of engaging portions 64, respectively, for preventing the clip 70 from escaping from the engaging portions 64. The pivoting portion 76 comprises a slantwise section 760 extending rearwards and downwardly from a bottom end of the rear sidewall 722 of the main body 72, a pressing section 762 extending rearwards and horizontally from a bottom end of the slantwise section 760, and a locking section 764 extending upwardly and perpendicularly from a distal end of the pressing section 762. When the clip 70 is locked with the second heat-conducting board 60, the slantwise section 760 and the locking section 764 extend through one pair of engaging holes 66, respectively, and the pressing section 762 abuts against a bottom face of the baffle shaft 68 of the second heat-conducting board 60 between the pair of engaging holes 66. A height of each of the sidewalls 721, 722 is less than that of the second evaporating section 42 of the second heat pipe 40. A distance between the two sidewalls 721, 722 is equal to or slightly more than a distance between two opposite lateral sides of the second evaporating section 42 of the second heat pipe 40, i.e. a width of the second evaporating section 42.

Referring to FIGS. 1-5 again, in assembly of the heat dissipation device, the second evaporating section 42 of the second heat pipe 40 is sandwiched between the second heat-conducting board 60 and the clips 70; the clasping portion 74 of each clip 70 hooks up with the pair of engaging portions 64 of the second heat-conducting board 60; the pivoting portion 76 of each clip 70 is fixed to the baffle shaft 68 of the second heat-conducting board 60; the main body 72 of each clip 70 is impelled to press the second evaporating section 42 downwardly and urge the second evaporating section 42 towards the second heat-conducting board 60, thereby securing the second heat pipe 40 to the second heat-conducting board 60 tightly and firmly. To release the second heat pipe 40 from the second heat-conducting board 60, the two arms 740 of each clip 70 are pressed to move towards each other and thus disengage from the hooking sections 642 of the pair of engaging portions 64. The clip 70 is then rotated away from the second heat pipe 40 in respect to the baffle shaft 68 of the second heat-conducting board 60. Thus, the second heat pipe 40 can be easily removed.

In use of the heat dissipation device, the first and second electronic components 100, 200 generate a lot of heat. The heat is absorbed by the first and second heat-conducting boards 50, 60, then transferred by the first and second heat pipes 30, 40 to the fin unit 10, and finally dispersed into ambient air via the fin unit 10, in which an airflow supplied by the centrifugal fan 20 flows through the fin unit 10, thereby preventing the electronic components 100, 200 from overheating. Due to detachable connecting structure of the clip 70, the second heat pipe 70 can be conveniently assembled to or disassembled from the second heat-conducting board 60; thus, the assembling and disassembling efficiency of the second heat pipe 40 is raised.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device adapted for dissipating heat from an electronic component mounted on a printed circuit board, the heat dissipation device comprising:
   a fin unit;
   a heat-conducting board for being attached to the electronic component, the heat-conducting board comprises
      a pair of engaging portions, each of the pair of engaging portions comprises an upright section protruding upwardly from a top face of the heat-conducting board,
      a hooking section extending horizontally from an upper end of the upright section, the hooking section of the each of the pair of engaging portions extends towards each other, and
      two elongated engaging holes are aligned with the pair of engaging portions;
   a heat pipe thermally connecting the fin unit and the heat-conducting board, the heat pipe extends between the two elongated engaging holes and the pair of engaging portions of the heat-conducting board; and
   a clip securing the heat pipe to the top face of the heat-conducting board, the clip comprising
      a pivoting portion which is pivotally fixed to the two elongated engaging holes of the heat-conducting board,
      a clasping portion detachably engaging with the pair of engaging portions, and
      a main body interconnecting the pivoting portion with the clasping portion, the main body spanning the heat pipe and urging the heat pipe towards the heat-conducting board, the main plate comprises a plate spanning a top face of the heat pipe, a front sidewall extending downwardly from a front lateral side of the plate, and a rear sidewall extending downwardly from a rear lateral side of the plate.

2. The heat dissipation device as claimed in claim 1, wherein the clasping section of the clip comprises two arms extending forwardly from right and left lateral sides of the main body and abutting against a bottom face of each of the hooking section upwardly, respectively.

3. The heat dissipation device as claimed in claim 1, wherein the front sidewall and the rear sidewall are attached to two lateral sides of the heat pipe, respectively.

4. The heat dissipation device as claimed in claim 1, wherein the clasping portion extends from the front sidewall of the main body, and the pivoting portion extends from the rear sidewall of the main body.

5. The heat dissipation device as claimed in claim 1, wherein the two elongated engaging holes are juxtaposed to each other, whereby a baffle shaft is formed between the two elongated engaging holes.

6. The heat dissipation device as claimed in claim 5, wherein the pivoting portion comprises a pressing section abutting against a bottom face of the baffle shaft, a slantwise section bended inclinedly and upwardly from a front lateral side of the pressing section and connecting with the rear sidewall of the main body of the clip, and a locking section bended upwardly from an opposite rear lateral side of the pressing section, and wherein the slantwise section and the locking section extend through the two elongated engaging holes, respectively.

7. The heat dissipation device as claimed in claim 1, wherein the heat pipe comprises an evaporating section attached to the heat-conducting board, a condensing section attached to the fin unit, and a bended connecting section interconnecting the evaporating section and the condensing section.

8. The heat dissipation device as claimed in claim 7 further comprising another heat-conducting board for being attached to another electronic component mounted on the printed circuit board, and another heat pipe thermally connecting the fin unit and the another heat-conducting board.

9. The heat dissipation device as claimed in claim 8, wherein the condensing section of the heat pipe and another condensing section of the another heat pipe are located juxtaposed to each other.

10. The heat dissipation device as claimed in claim 9, wherein a centrifugal fan is located adjacent to the fin unit, and the centrifugal fan comprises a housing and an impeller rotatably disposed in the housing, and an air outlet is defined at a right lateral side of the housing, and the fin unit is partly received in the air outlet.

11. The heat dissipation device as claimed in claim 9, wherein an elongated receiving groove is defined at a lateral side of the fin unit facing the air outlet of the centrifugal fan, the condensing section of the heat pipe and the another condensing section of the another heat pipe being accommodated in the elongated receiving groove and thermally connected to a portion of the fin unit surrounding the elongated receiving groove.

12. The heat dissipation device as claimed in claim 1, wherein a plurality of spaced mounting arms extend outwardly and horizontally from an outer periphery of the heat-conducting board, and each of the mounting arms defines a mounting hole at a center thereof.

13. The heat dissipation device as claimed in claim 12, wherein a positioning hook is bent downwardly from an end of each mounting arm to secure the heat-conducting board to the printed circuit board.

* * * * *